(12) United States Patent
Strang

(10) Patent No.: US 7,217,336 B2
(45) Date of Patent: May 15, 2007

(54) DIRECTED GAS INJECTION APPARATUS FOR SEMICONDUCTOR PROCESSING

(75) Inventor: Eric J. Strang, Chandler, AZ (US)

(73) Assignee: Tokyo Electron Limited, Tokyo (JP)

( * ) Notice: Subject to any disclaimer, the term of this patent is extended or adjusted under 35 U.S.C. 154(b) by 281 days.

(21) Appl. No.: 10/482,210

(22) PCT Filed: Jun. 20, 2002

(86) PCT No.: PCT/US02/16583

§ 371 (c)(1),
(2), (4) Date: Dec. 29, 2003

(87) PCT Pub. No.: WO03/002860

PCT Pub. Date: Jan. 9, 2003

(65) Prior Publication Data

US 2004/0163761 A1    Aug. 26, 2004

(51) Int. Cl.
*H01L 21/306* (2006.01)
*C23C 16/455* (2006.01)
*C23C 16/52* (2006.01)
*G06F 19/00* (2006.01)

(52) U.S. Cl. ............... 156/345.34; 156/345.24; 156/345.26; 156/345.33; 118/715; 118/692; 118/696; 118/708; 700/121; 700/123; 700/175

(58) Field of Classification Search ........... 118/715, 118/692, 696, 708; 156/345.24, 345.26, 156/345.33, 345.34; 700/121, 123, 175
See application file for complete search history.

(56) References Cited

U.S. PATENT DOCUMENTS

| | | | | |
|---|---|---|---|---|
| 5,423,936 | A | 6/1995 | Tomita et al. | 156/345 |
| 5,812,403 | A * | 9/1998 | Fong et al. | 700/121 |
| 6,106,663 | A | 8/2000 | Kuthi et al. | 156/345 |
| 6,239,036 | B1 | 5/2001 | Arita et al. | 438/714 |
| 6,645,303 | B2 * | 11/2003 | Frankel et al. | 118/725 |
| 6,852,167 | B2 * | 2/2005 | Ahn | 118/715 |
| 7,103,443 | B2 * | 9/2006 | Strang | 700/175 |
| 2002/0132374 | A1 * | 9/2002 | Basceri et al. | 438/3 |
| 2002/0160125 | A1 * | 10/2002 | Johnson et al. | 427/569 |
| 2004/0163761 | A1 * | 8/2004 | Strang | 156/345.33 |
| 2004/0166597 | A1 * | 8/2004 | Strang | 438/5 |

FOREIGN PATENT DOCUMENTS

WO      WO 01/12873 A1 *  2/2001

OTHER PUBLICATIONS

The International Preliminary Examination Report PCT/US02/16583.*

* cited by examiner

*Primary Examiner*—Jeffrie R. Lund
(74) *Attorney, Agent, or Firm*—Oblon, Spivak, McClelland, Maier & Neustadt, P.C.

(57) ABSTRACT

A method and system (1) for utilizing shaped orifices (e.g., sonic and simple orifices, and divergent nozzles) in the gas inject system (20) as part of a plasma process system. By utilizing the shaped orifices, directionality of gas flow (25) can be improved. This improvement is especially beneficial in high aspect ratio processing.

20 Claims, 9 Drawing Sheets

DIRECTED GAS INJECTION APPARATUS FOR SEMICONDUCTOR PROCESSING

CROSS-REFERENCE TO RELATED APPLICATIONS

This application is related to application Ser. No. 60/272,452, filed Mar. 2, 2001 entitled "SHOWER-HEAD GAS INJECTION APPARATUS WITH SECONDARY HIGH PRESSURE PULSED GAS INJECTION" and application Ser. No. 60/310,436, filed on Jun. 29, 2001 entitled "DIRECTED GAS INJECTION APPARATUS FOR SEMICONDUCTOR PROCESSING". This application is also related to and claims priority to application Ser. No. 60/301,413 filed on Jun. 29, 2001. The contents of those applications are incorporated herein by reference.

BACKGROUND OF THE INVENTION

1. Field of the Invention

The present invention is directed to a method and system for utilizing a shaped orifice or nozzle in a plasma processing system.

2. Discussion of the Background

During the fabrication of integrated circuits (IC), a conventional approach to oxide etch employs a capacitively coupled plasma (CCP) source, wherein a process gas comprising argon, $C_xF_y$ (e.g. $C_4F_8$), and $O_2$ is introduced to a low pressure environment to form plasma Therefrom, the plasma dissociation chemistry is tuned for optimal production of the chemical reactant suitable for chemically reacting with the substrate surface material to be etched (i.e., $CF_2$ for selective oxide etch). Moreover, the plasma further produces a population of positively charged ions (e.g. singly charged argon $Ar^+$) suitable for providing energy to the substrate surface to activate the etch chemistry. In general, a substrate RF bias is employed to attract ions to the substrate surface in a controllable, directional manner to affect the ion energy at the substrate surface and to provide an anisotropic etch for desired feature side-wall profiles.

Due to the differing roles of the atomic, molecular, and ionic species present in the plasma, it is believed that oxide etch comprises two fundamentally unique processes. Firstly, electrons are heated in the plasma whereby collisions with fluorocarbon species leads to dissociation and formation of radical species, e.g. $CF_3$, $CF_2$, CF, F, etc. And secondly, electrons are heated to energies sufficient to ionize argon atoms, whereby the resultant ions are utilized to energize substrate surface $CF_x/SiO_2$ chemical reactions.

For instance, referring to FIG. 1, an exploded view of an etch feature in an oxide layer is shown. In the plasma, fluorocarbon radicals are formed. Thereafter, they diffuse to the substrate and deposit onto the etch feature surfaces. Preferably, an increased concentration of $CF_2$ radical local to the wafer surface can lead to several advantages (Nakagawa et al. 1998, Booth 1998, Kiss et al. 1992, Butterbaugh et al. 1991, Tatsumi et al. 1998), in particular: (1) the formation of a $CF_x$ polymer layer atop the patterned photoresist tends to protect the resist during the etch process for improved selectivity of $SiO_2$-to-resist etch, (2) the formation of $CF_x$ polymer layer along sidewalls provides protection for improved etch anisotropy, and (3) the formation of $CF_2$ at the bottom of a feature provides a suitable etch reactant for selective etch of oxide relative to silicon that produces volatile products, i.e. one of many chemical reactions can be $2CF_2 + SiO_2 \rightarrow SiF_4 + 2CO$. Thereafter, the directional nature of the ion bombardment of the substrate surface, as shown in FIG. 2, leads to an anisotropic etch, wherein the argon ion energy is sufficient to activate the etch chemistry in the etch features.

One technique proposed in the archival literature as described above to improve high aspect ratio contact etch in oxide (e.g. etch rate, side-wall profile, selectivity, etc.) suggests optimization of the plasma chemistry to form $CF_2$ radical. In doing so, studies have shown that the concentration of fluorocarbon radicals, particularly $CF_2$, correlate well with $\tau n_e \langle \sigma v \rangle$, where $\tau$ is the gas residence time, $n_e$ is the electron density, $\sigma$ is the dissociation collision cross-section, v is the electron velocity and $\langle \sigma v \rangle$ is the integration of the product $\sigma v$ with the normalized electron energy distribution function (Tatsumi et al. 1998). Hence, conventional practice entails adjusting the plasma density to optimize the concentration of the preferred etch radical to achieve the enumerated conditions above and, in general, for oxide etch it can lead to limitations on the maximum etch rate. This shortcoming is often governed by the demand for meeting an etch selectivity specification or a side-wall profile specification. For instance, the etch rate is typically proportional to the plasma density (ion density equals the electron density for a quasi-neutral plasma, and either can be referred generally as the plasma density), whereas the etch selectivity can be inversely proportional to the plasma density once the plasma density is sufficiently large to produce a highly dissociated radical concentration (i.e. high fluorine radical concentration for etching oxide with $C_xF_y$ process chemistry). Moreover, inappropriate chemistry due to excessively high dissociation rates can lead to inadequate protection of feature side-walls and therefore jeopardize side-wall profiles leading to an isotropic etch. Lastly, insufficient plasma density and low dissociation (i.e. high concentrations of $CF_3$, $CF_2$, etc.) can lead to etch stop due to material (i.e. C) build-up at the bottom of etch features. Therefore, due to the close relationship between the plasma density and the preferred radical concentration, this results in a very narrow parameter space wherein one must work to achieve marginally acceptable performance specifications for etch rate, etch selectivity and side-wall profile (or anisotropy). This is a major shortcoming for conventional hardware and process practice particularly since the etch requirements vary during the period one etches a deep, high aspect ratio contact.

For a typical shower-head gas injection system utilized in a conventional semiconductor processing device, the inject plate generally comprises an array of several hundred (several hundred to several thousand) inject orifices through which gas is introduced to the processing region at a flow rate equivalent to 100–1000 sccm argon. Furthermore, the injection orifice is typically a cylindrical orifice as shown in FIG. 3 characterized by a length L and diameter d, wherein the ratio of the orifice length to the orifice diameter L/d is greater than 10 (i.e. L/d>>1). For instance, a typical orifice diameter is 0.5 mm and a typical orifice length is 1 cm, and therefore the aspect ratio L/d=20.

As a consequence of this design, the gas effuses from the orifice exit with a very broad angular distribution characteristic of a low discharge coefficient orifice. The discharge coefficient of an orifice $C_D$ is given by the ratio of the real mass flow rate to the isentropic mass flow rate. The isentropic mass flow rate can be derived from the Euler equations (or inviscid Navier-Stoke's equations) for a quasi-one dimensional frictionless and adiabatic flow, viz.

$$m_{isentropic} = P_t \left(\frac{\gamma+1}{2}\right)^{-1/(\gamma+1)} \sqrt{\frac{2\gamma}{\gamma RT_t(\gamma+1)}} \, A, \quad (1)$$

where $\gamma$ is the ratio of specific heats for the gas, R is the gas constant, $P_t$ is the total pressure, $T_t$ is the total temperature and A is the minimum cross-sectional (throat) area (i.e. $A=\pi d^2/4$). When $C_D \ll 1$, the total pressure recovery through the orifice is severely reduced and hence the angular distribution of the orifice flux becomes very broad. Therefore, a shortcoming of conventional gas injection system designs is a relatively low gas injection orifice discharge coefficient.

Furthermore, conventional systems suffer from a lack of control of the gas injection orifice discharge coefficient. In many cases, the gas injection orifice is subjected to erosion and, hence, the gas injection properties vary in time during a process, from substrate-to-substrate and batch-to-batch. Conventional systems do not monitor the state of a "consumable" gas injection system nor do they attempt to control the gas injection properties to prolong the life of a "consumable" gas injection system.

In addition to gas injection orifices with an uncontrollable discharge coefficient, conventional designs suffer from an additional shortcoming. That is the gas injection orifices are not oriented relative to one another to provide a uniform, directional flow local to the substrate surface.

SUMMARY OF THE INVENTION

It is an object of the present invention to provide a gas injection system design comprising one or more gas injection orifices, each of which is tailored to improve the orifice discharge coefficient.

It is another object of the present invention to provide a gas injection system design comprising one or more gas injection orifices, each of which is tailored to improve the gas flow directivity at the orifice exit.

It is another object of the present invention to provide a gas injection system design comprising one or more gas injection orifices, each of which is tailored to improve the flux of chemical species normal to the substrate surface.

It is an object of the present invention to provide a gas injection system design comprising a plurality of gas injection orifices, each of which is arranged relative to one another to improve the spatial uniformity of the flux of chemical species normal to the substrate surface.

It is another object of the present invention to provide a gas injection system design comprising one or more gas injection orifices, a sensor to monitor an intrinsic gas injection parameter and a controller, the use of which enables monitoring the state of the one or more gas injection orifices. The state of the gas injection orifices can be used to determine consumable replacement.

It is another object of the present invention to provide a gas injection system design comprising one or more gas injection orifices, a sensor to monitor an intrinsic gas injection parameter and a controller, the use of which enables monitoring the state of the one or more gas injection orifices. The current state of the gas injection orifices can be used to return the current state to the design state, hence controlling the gas injection orifices and prolonging consumable lifetime.

DETAILED DESCRIPTION OF THE PREFERRED EMBODIMENT

In order to improve etch rate, etch selectivity and etch feature side-wall profile, the present invention improves a gas injection design utilized in a material processing device to affect improvements in chemical transport local to an exposed substrate surface. (As used herein, "substrate" means any workpiece processed in a plasma environment, including, but not limited to semiconductor wafers and liquid crystal display panels.) The exposed substrate surface is exposed to either material etch or deposition steps, the combination of which serve to alter the material composition and/or topography of the exposed substrate surface. When the material processing device utilizes a processing plasma, the improvements to the chemical transport can affect the dissociation chemistry and hence radical concentrations, as well as affect radical transport near the substrate surface high aspect ratio features. The present invention utilizes an improved gas injection orifice design to maximize the orifice discharge coefficient and a spacing of gas injection orifices to provide a uniform, directional gas flow normal to the substrate surface.

Figure 4:
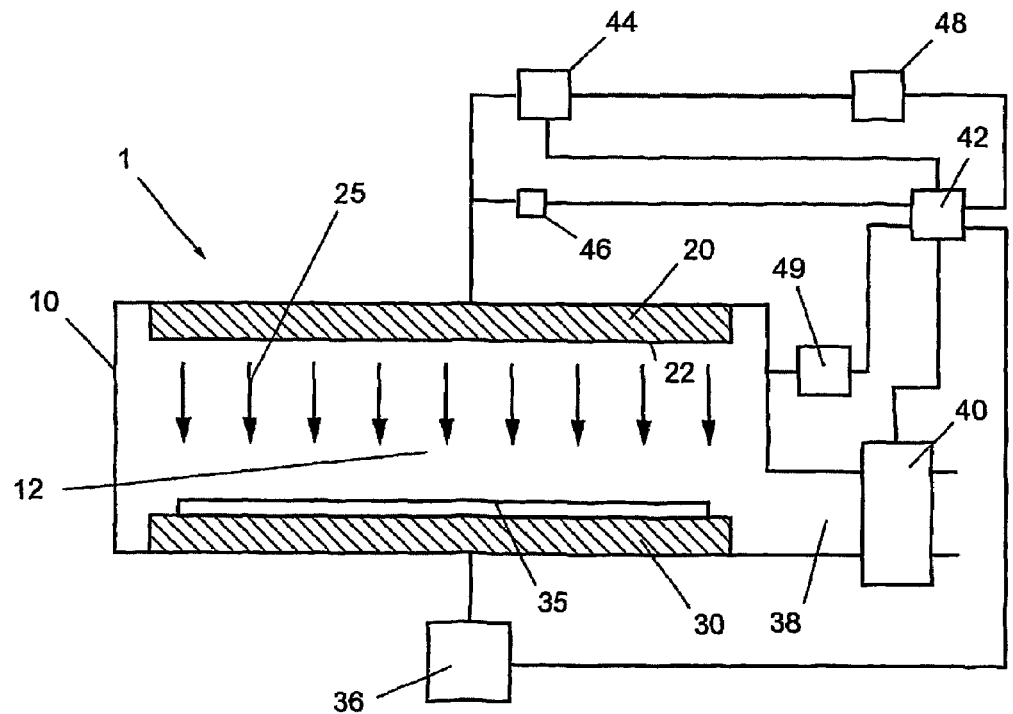
FIG. 4 is a schematic cross-section of a material processing system according to an embodiment of the present invention.

FIG. 4 illustrates a schematic representation of a material processing system 1 comprising processing chamber 10 wherein processing region 12 is provided. The processing region 12 preferably contains a gas at reduced pressure and plasma. The material processing chamber 10 further comprises upper gas injection plate 20 through which processing gas 25 enters processing chamber 10. Additionally, chamber 10 provides substrate holder 30 upon which substrate 35 rests, wherein an upper surface of substrate 35 is exposed to processing region 12. Furthermore, the substrate holder 30 can be vertically translated by translation device 36 such that the spacing h between the exposed surface of substrate 35 and gas injection plate 20 can be varied. Effluent gas from processing region 12 is exhausted through chamber port 38 to vacuum pump 40. The materials processing system 1 further includes controller 42 coupled to mass flow controller 44, pressure sensor 46, gas supply 48, vacuum pump 40 (gate valve, etc.), chamber pressure sensor 49 and substrate holder translation device 36. Improvements to the design of the gas injection plate 20 can facilitate improvements in material processing of the substrate 35, and these features are described below.

Figure 5A:
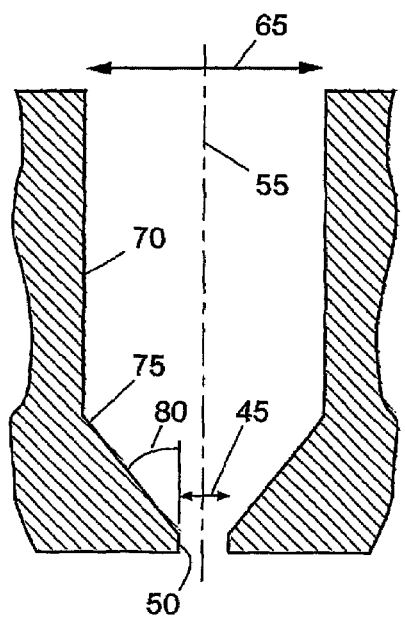
FIG. 5A is a sonic orifice according to the first aspect of the present invention.
Figure 5B:
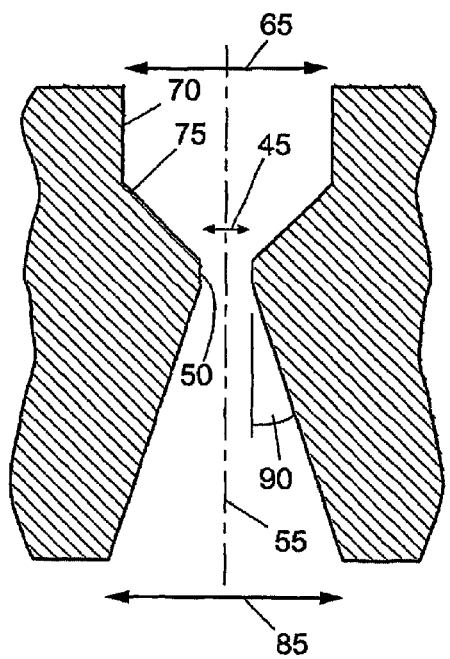
FIG. 5B is a divergent nozzle according to a second aspect of the present invention.
Figure 5C:
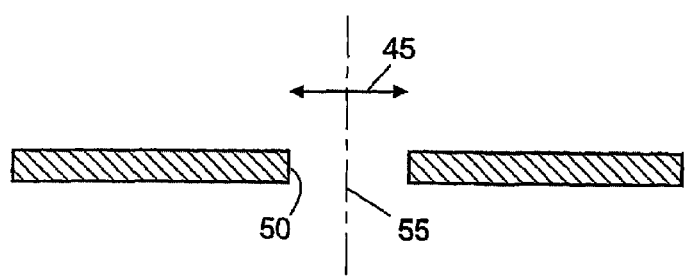
FIG. 5C is a simple orifice according to a third aspect of the present invention.

FIGS. 5A, 5B, and 5C present three exemplary embodiments of a gas injection orifice according to the present invention. The first cross-section (FIG. 5A) is referred to as a sonic orifice having throat 45 with throat diameter d (e.g., d is on the order of 0.025 to 0.5 mm) and first sidewall 50 with length L. Preferably, the aspect ratio L/d is much less than unity (i.e. L/d<<1). The discharge coefficient (as defined above) is very sensitive to the ratio of the length L of the minimum area cross-section (e.g., first sidewall 50) to the diameter d of the minimum area cross-section (e.g., throat 45). Generally, first sidewall 50 of throat 45 is parallel to orifice centerline 55. The gas injection orifice further includes an inlet 65 to permit gas to enter orifice throat 45. Depending upon the thickness of the material within which the gas injection orifice is fabricated, the orifice inlet 65 can comprise a passage with second sidewall 70 of a finite entry length and a cross-sectional area substantially greater than the cross-sectional area of the throat 45. For example, the cross-sectional area of inlet 65 is preferably a factor of ten (10) greater than the cross-sectional area of throat 45. The design of inlet 65 is such that gas passes between second sidewall 70 until the gas arrives at throat entry wall 75 prior to throat 45. In one embodiment (not shown), the throat entry wall 75 remains flat until the first sidewall 50 (where the opening for the throat 45 begins).

In the illustrated embodiment, shown in FIG. 5A, the throat entry wall 75 comprises a slope (having an angle α indicated as 80 in FIG. 5A) between the throat entry wall 75 and the orifice centerline 55 (thereby forming a conical section at the entrance to throat 45). The entrance angle 80 is preferably 45 degrees; however, entrance angle 80 of throat entry wall 75 can vary from 30 to 90 degrees as described above (an entrance angle 80 of 90 degrees is equivalent to a "flat" throat entry wall 75 as described above).

FIG. 5B illustrates a cross-section of a second embodiment of an inject orifice, namely a divergent nozzle. The divergent nozzle includes a throat 45 of diameter d (e.g., d is on the order of 0.025 to 0.5 mm) and a corresponding aspect ratio L/d<<1 (e.g., L/d<0.5). Beyond the nozzle throat, there exists a conically divergent section that undergoes a diameter increase from the throat 45 of diameter d to the exit 85 of diameter $d_e$ with an exit diameter ratio $d_e/d$ on the order of 4. The purpose of the conical section is to restrain the rate at which the gas expands into the low pressure environment. In general, the angle β indicated as 90 in FIG. 5B should not exceed approximately 18 degrees in order to minimize radial flow losses and possibly deter flow separation from the nozzle walls. In addition, a small angle can lead to excessive nozzle lengths for a given area ratio as well as increased friction losses. The angle 90 is preferably 5<β<20 degrees, and more preferably 15<β<20 degrees. The conical section can be replaced with a concave section, particularly a smooth wall contour designed using the Method of Characteristics (i.e., a "perfect" nozzle or "minimum-length" nozzle). For example, if one wishes to maximize the mean (spatial) pressure sensed at the substrate surface, one would choose the sonic orifice when Kn>0.005 and one would choose the divergent nozzle when Kn<0.005, assuming a Knudsen number Kn derived from an estimation of the mean free path estimated using the variable hard sphere (VHS) model; Bird, G. A., *Molecular gas dynamics and the direct simulation of gas flows*, Clarendon Press, Oxford (1994).

In a third embodiment, shown in FIG. 5C, the inlet 65, entry region with walls 70 and throat entry wall 75 are removed, and the gas injection orifice is fabricated within a piece of material of thickness equivalent to the length L of wall 50 (or throat 45). The embodiment described in FIG. 5C is hereinafter referred to as a simple orifice.

In summary, the difference in gas orifice geometry between (1) a showerhead orifice and (2) a shaped orifice or nozzle (e.g., a sonic orifice or a divergent nozzle) leads to significantly different flow conditions.

Figure 6:
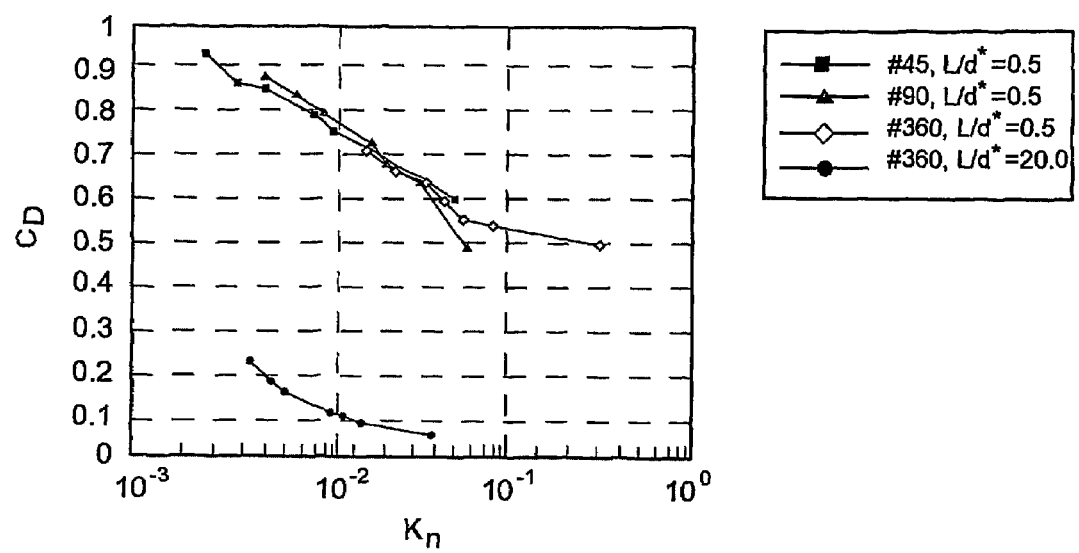
FIG. 6 is a graph showing a relation between orifice Knudsen number Kn and orifice aspect ratio L/d, and discharge coefficient.

FIG. 6 presents the measured discharge coefficient versus the orifice Knudsen number Kn. The orifice Knudsen number represents the ratio of the mean free path at total (or stagnation) conditions to the throat diameter d. Note that Kn<0.01 signifies the continuum regime, 0.01<Kn<1 signifies the transition regime, and Kn>1 signifies the free molecular flow regime. Clearly, the discharge coefficient is significantly larger for an aspect ratio of L/d=0.5 versus and aspect ratio L/d±20 (by a factor of 4 to 5), for a wide range of Kn.

The discharge coefficient for the sonic orifice can lead to a narrow angular distribution of the orifice flux. In other words, an increase in the inject total pressure (or decrease in the Knudsen number) and/or a high discharge coefficient can produce a highly directed gas jet.

With continuing reference to FIGS. 5A–C, a gas injection orifice design was described to increase or maximize the discharge coefficient $C_D$ (shown in FIG. 6). However, more generally, a relationship between the gas injection performance local to the orifice and two locally defined parameters, namely the orifice aspect ratio L/d and the orifice Knudsen number Kn, was established. Therefore, a parameter $\Pi_1$, e.g. a measurable such as the discharge coefficient $C_D$, can be described by these two parameters, i.e. $C_D = C_D$ (L/d, Kn). For example, by using the rules of non-dimensional analysis, the above parameters are made interchangeable, and one can re-write the above expression as $\Pi_1 = \Pi_1$ ($C_D$, L/d). From experiment, the gas injection orifice design, described by the above expression, strongly affects the number density proximate the exposed surface of substrate 35 and to second order it affects the probability distribution function of the incidence angle (at the surface of the substrate) to be described below.

Figure 7:
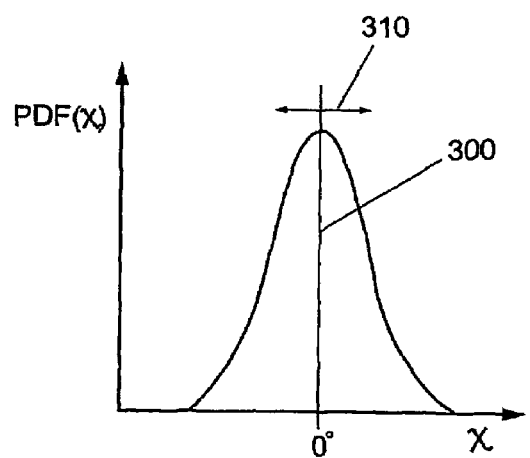
FIG. 7 is a schematic illustration of a probability distribution function of gas velocity angle local to the substrate surface.

Referring now to FIG. 4, process gas 25 enters processing region 12 through a gas injection plate 20, wherein surface 22 of gas injection plate 20 is substantially parallel to the exposed surface of substrate 35. For example, process gas 25 is injected in a direction substantially normal to the surface of substrate 35. An exemplary probability distribution function (PDF) of the gas velocity angle χ relative to the surface normal vector at the surface of substrate 35 is shown in FIG. 7 for a location directly below a gas injection orifice in gas injection plate 20. Therefore, it is most probable at this location that atoms/molecules are moving normal (striking at an angle indicated in FIG. 7 as 300) to the surface of substrate 35 (however, this observation is not true when one moves laterally away from a location directly "in-line" with a gas injection orifice). The "narrowness" or "broadness" of the PDF is strongly dependent on the background pressure and the spacing h between the surface 22 of gas injection plate 20 and the exposed surface of substrate 35. Furthermore, the probability distribution function of the incidence angle PDF($\chi$) is strongly affected by the relative spacing of the gas injection orifices $\Delta$s in gas injection plate 20 to the spacing h between the exposed surface of substrate 35 and gas injection plate 20.

In order to affect change in the mass transport proximate the exposed surface of substrate 35 (or the entrance regions to etch or deposition features), two dependent parameters, described above, are available. The flux of mass into an etch or deposition feature is dependent on: (1) the gas number density proximate the exposed surface of substrate 35, and (2) the probability of an atom/molecule striking the surface at an angle substantially near normal incidence. Considering the above discussion, a second property $\Pi_2$ is expressed as a function of the discharge coefficient $C_D$, the orifice aspect ratio L/d, the relative gas injection orifice spacing $\Delta$s/h (where $\Delta$s is the gas injection orifice spacing on gas injection plate 20 and h is the spacing (or distance) between the gas injection plate 20 and the exposed surface of substrate 35) on gas injection plate 20, and a chamber Knudsen number $Kn_c$, i.e. $\Pi_2=\Pi_2 (C_D, L/d, \Delta s/h, Kn_c)$. The first two dependent variables ($C_D$ and L/d) are related to the design of the gas injection orifice as discussed with reference to FIGS. 5A–C. The design of the gas injection orifice can strongly affect the gas number density proximate the exposed surface of substrate 35 and to a lesser degree the incidence angle probability distribution function. The third variable relates to the relative spacing of gas injection orifices on gas injection plate 20 and strongly affects incidence angle probability across the exposed surface of substrate 35. The preferred selection of $\Delta$s/h is discussed below. Lastly, the fourth variable is a Knudsen number based upon chamber conditions or the background pressure; i.e. $Kn_c=\lambda_c/h$, where $\lambda_c$ is the mean free path defined using the (background) chamber pressure. For example, when $Kn_c$ is large, PDF($\chi$) is narrow and, when $Kn_c$ is small, PDF($\chi$) is broad.

To affect changes in the transport properties proximate substrate 35, the first dependent variable described above (related to gas injection orifice design), the discharge coefficient $C_D$, can be adjusted during substrate processing and from wafer-to-wafer, and the second dependent variable, the orifice aspect ratio L/d, can be designed a priori. In other words, the aspect ratio (although varying during processing due to plasma erosion of the orifice) is generally not controllable during the processing of a single wafer. Changes to $C_D$ can be achieved via changes to the injection total pressure (or mass flow rate). For example, an increase in the injection total pressure (or an increase in the mass flow rate) can cause an increase in the discharge coefficient. The adjustment of $C_D$ is described in greater detail below.

To affect changes in the transport properties proximate substrate 35, the third variable, the relative spacing $\Delta$s/h, can be adjusted during substrate processing and from substrate-to-substrate through changes to h via vertical translation of substrate holder 30 using translation device 36.

To affect changes in the transport properties proximate substrate 35, the fourth variable, the (background) chamber Knudsen number $Kn_c$, can be adjusted during substrate processing and from substrate-to-substrate. Changes to $Kn_c$ can be affected through changes either to the spacing h, and/or the (background) chamber pressure via translation device 36 and mass flow rate and/or vacuum pump throttle valve setting coupled with chamber pressure sensor 49, respectively.

Figure 1:
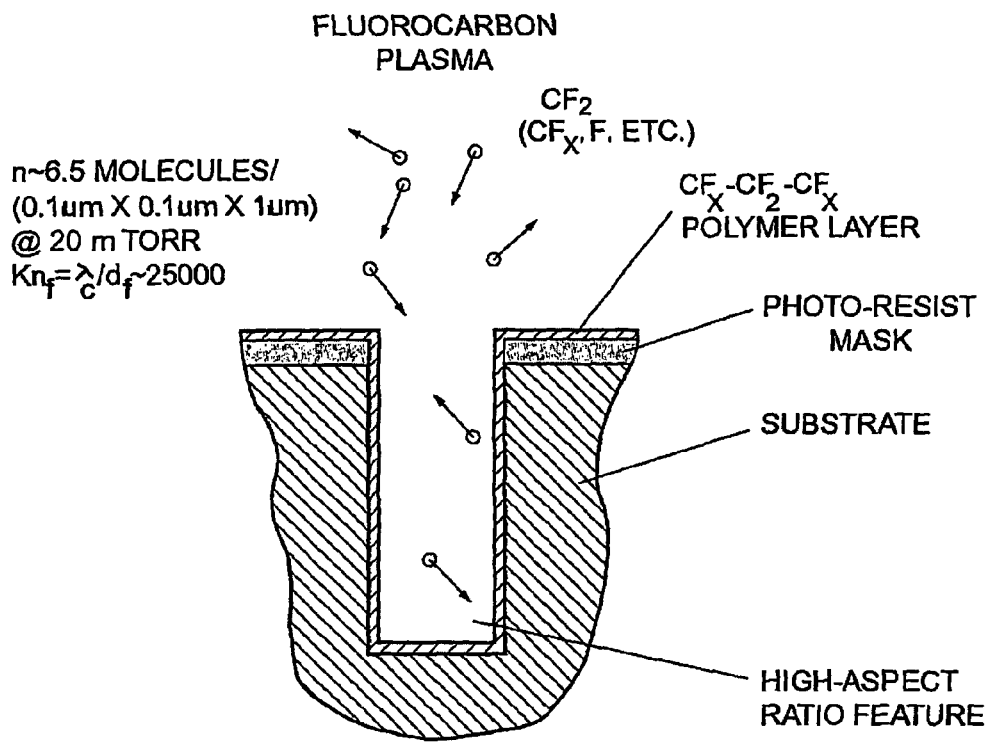
FIG. 1 is a cross-section of a high-aspect ratio feature being etched by a fluorocarbon plasma.
Figure 2:
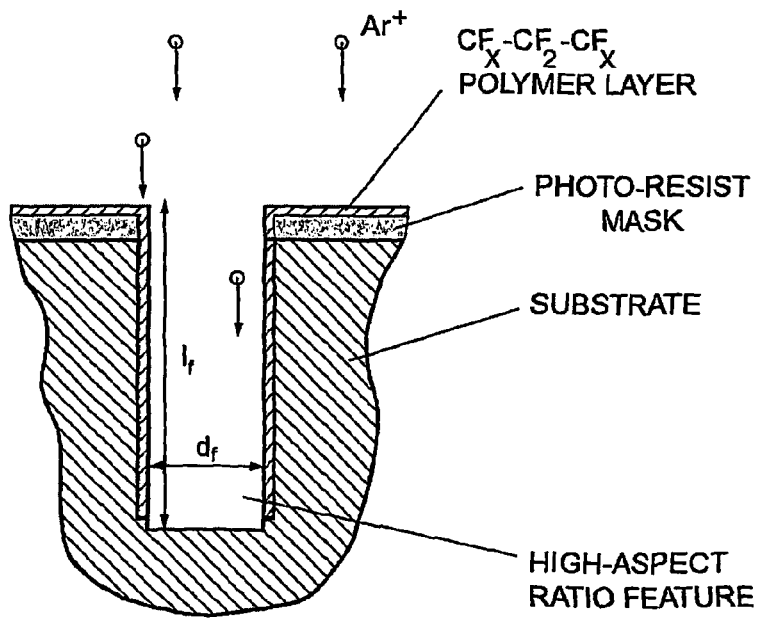
FIG. 2 is a cross-section of a high-aspect ratio feature being etched in the presence of an Argon plasma.
Figure 8:
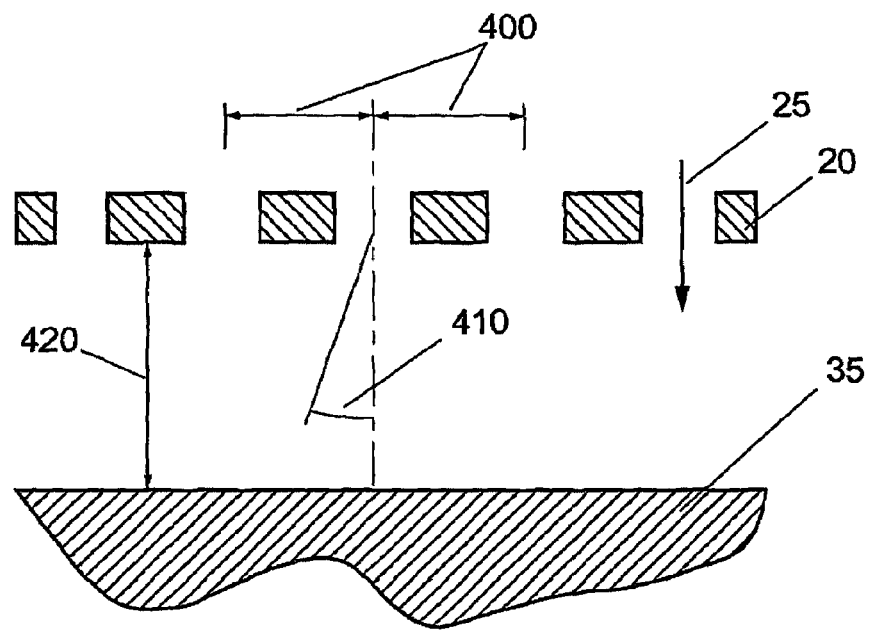
FIG. 8 is a schematic cross-section of an embodiment for a gas injection orifice spacing.

Still referring to FIG. 7, in order to maximize the probability of finding an atom/molecule moving in a direction substantially normal to the surface of substrate 35, or within a specified angular range 310, the spacing of gas injection orifices is determined according to the following relation $$\Delta s = 2 h \tan (\phi), \quad (2)$$

where $\Delta$s is the gas injection orifice spacing as indicated by 400 in FIG. 8, $\phi$ is an acceptable angular deviation (half-angle) from normal incidence as indicated by 410 in FIG. 8, and h is the spacing (or distance) between the gas injection plate 20 and the exposed surface of substrate 35 as indicated by 420 in FIG. 8. In order to optimize the transport of mass into an etch or deposition feature, the half-angle $\phi$ should coincide with the feature acceptance half-angle $\phi_f=\tan^{-1}(d_f/2l_f)$, where $d_f$ is the feature diameter (or lateral length scale) and If is the feature length (or longitudinal length scale); see FIG. 2. In other words, $\phi \leq \phi_f$, or the inverse of the relative gas injection orifice spacing h/$\Delta$s should coincide with the feature aspect ratio $AR=l_f/d_f$, i.e. h/$\Delta s \geq AR$.

Figure 9:
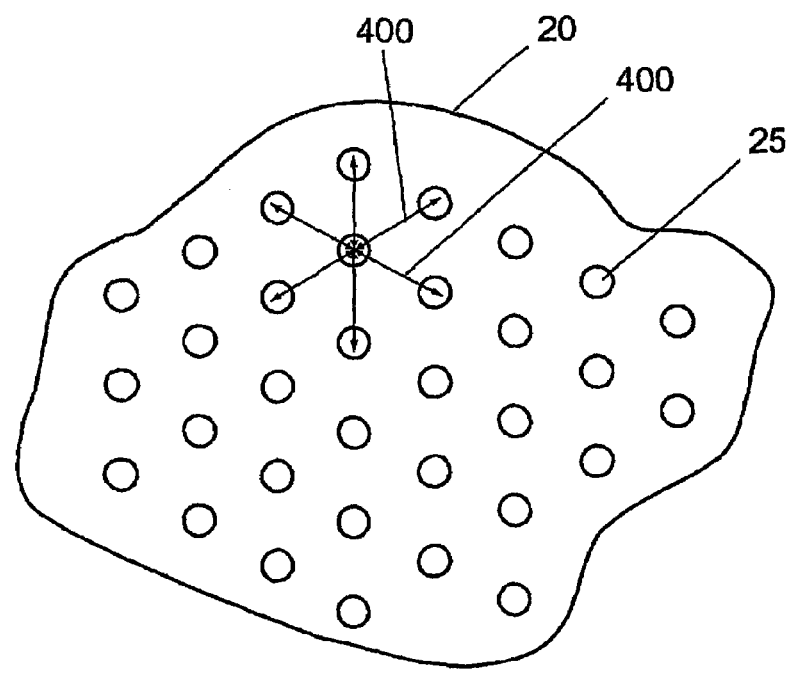
FIG. 9 is a schematic plan-view of an embodiment for a gas injection orifice spacing.

FIG. 9 presents a plan view of a gas injection plate 20 comprising a plurality of gas injection orifices through which process gas 25 flows, wherein the orifices are aligned preferably in a hexagonal pattern such that the spacing ($\Delta$s) 400 between any given orifice and an adjacent (surrounding) orifice is the same.

Lastly, the (background) chamber Knudsen number $Kn_c$ is preferably selected such that the full-width half maximum $\delta_{FWHM}$ of PDF($\chi$) is approximately equivalent to twice the feature acceptance half-angle $2\phi_f$ in order to optimize the efficiency of mass transport into etch or deposition features. For example, when h=25 mm and AR=10(:1), the (background) chamber pressure is approximately 2 to 5 mTorr to satisfy this condition. When coupling together the design criteria for gas injection orifice spacing, pattern, chamber conditions and orifice cross-section (i.e. FIGS. 5A, 5B and 5C), the design of the gas injection plate 20 can uniformly maximize the number of atoms/molecules moving substantially normal to the surface of substrate 35 within plus or minus an angular range 310. For example, by maximizing both the number of atoms/molecules local to the surface of substrate 35 and the probability of finding an atom/molecule moving in a direction substantially normal to the surface of substrate 35, the plasma process can be optimized.

For example, in oxide etch, the array of gas injection orifices continuously injects a process gas (i.e. $C_4F_8$) diluted with an inert gas (e.g., argon) into the processing region 12. One example of a gas specie process recipe can include 300 sccm argon, 5 sccm $C_4F_8$ and 10 sccm oxygen. For such a flow rate, the inject total pressure is approximately 5 Torr for an array of 36000 inject orifices (d=0.05 mm, L=0.025 mm) and a mass flow rate of 400 sccm argon. In such a design, the gas injection orifices can be spaced every one (1) millimeter in a hexagonal pattern, hence, leading to a uniform, directional flow near the surface of the substrate 35 optimized for normal incidence plus or minus one (1) degree (e.g. one (1) degree is less than the requirement suitable for 12:1 aspect ratio feature etch or deposition). The gas injection orifice spacing ($\Delta$s) 400 is determined to be one (1) mm for a distance h between the gas injection plate 20 and the exposed surface of substrate 35 of 25 mm (or one inch).

The sonic orifice, divergent nozzle, or simple orifice, as described in FIGS. 5A, 5B, and 5C, can be fabricated using a wide range of materials such as stainless steel, aluminum, alumina, silicon, quartz, silicon carbide, carbon, etc. When fabricated from aluminum, the orifices/nozzles can be anodized to provide erosion protection from the plasma Furthermore, the gas injection orifices can be spray coated with $Y_2O_3$ to provide a protective barrier. The sonic orifice or divergent nozzle can be manufactured using a broad variety of machining techniques such as diamond bit machining, sonic milling, laser cutting, etc., and, in some applications, orifice fabrication can be amenable to etching. In fact, if the total thickness of the material through which an orifice/nozzle is fabricated is of order a millimeter, orifice etching is within current practical etch rates and reasonable processing times.

Figure 10:
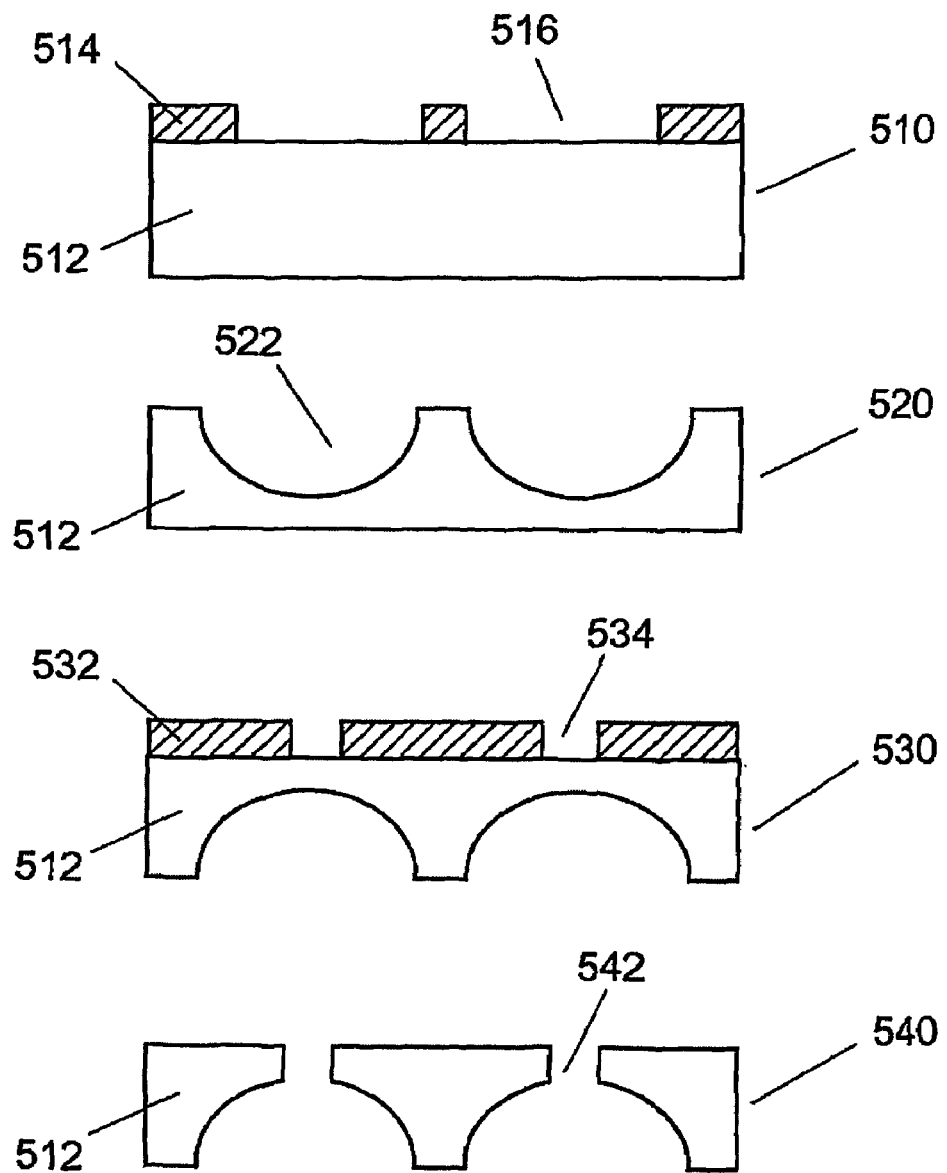
FIG. 10 is a schematic illustration of a method to fabricate gas injection orifices.
Figure 11:
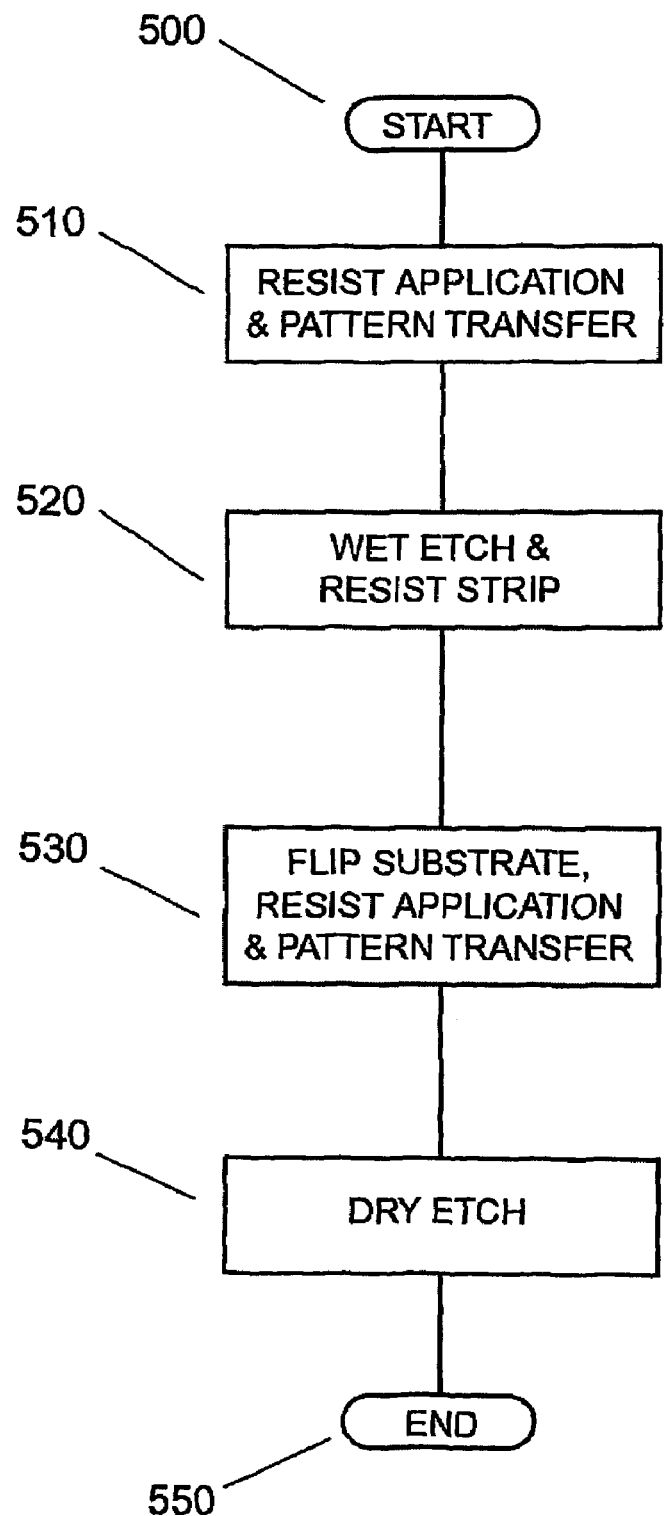
FIG. 11 is a procedure to fabricate gas injection orifices.

For example, FIGS. 10 and 11 describe a method for fabricating one or more gas injection orifices in a plate substrate (i.e. 750 micron thick poly-Si wafer). In FIG. 10, the fabrication steps are illustrated and the procedure is mirrored in the list of steps provided in FIG. 11. The fabrication process is started in step 500. Step 510 proceeds with the application of a photo-resist film 514 to a first surface of the plate substrate 512 and a pattern 516 is transferred to the photo-resist film via photolithography. The patterned feature width can be approximately 1400 microns.

In step 520, a feature 522 is wet etched within the plate substrate 512 by immersing the plate substrate 512 in a KOH/alcohol solution for a period of time dictated by the time required to etch the (isotropic) feature 522 to a depth of approximately 700 micron or greater. Once the wet etch is complete, the photo-resist mask 514 is removed.

In step 530, the plate substrate 512 is flipped and a second photo-resist film 532 is applied to a second (opposite) surface of plate substrate 512 and a pattern 534 is transferred to the photo-resist film 532 via photolithography. The patterned feature width can be approximately 50 microns.

In step 540, the plate substrate 512 is dry etched utilizing a $SF_6/O_2(C_4F_8)$ or $Cl_2$ chemistry in a plasma processing device well-known to those of skill in the art and gas injection orifices (d=0.050 mm, L≦0.050 mm) can be formed. Typical etch rates are 50 micron per minute and, therefore, the dry etch time to complete the gas injection orifice fabrication is expected to be less than a minute. Once the etch is complete, the photo-resist 532 is stripped. The process ends in step 550.

Fabrication in silicon has some additional advantages, since it can be useful in oxide etch processes as a (fluorine) scavenger; however, it is consumed in time leading to orifice erosion. If so, the performance of the gas injection orifices can be observed by monitoring the injection total pressure using pressure sensor 46 (FIG. 4). A reduction in the injection total pressure can imply erosion of the gas injection orifices (i.e., opening of the gas injection orifices or increase in the minimum cross-sectional area A or reduction in length L). This information can be used to determine the replacement lifetime of a consumable gas injection plate 20.

Referring again to FIG. 4, process gas originates in gas supply 48, is coupled to a mass flow controller 44 to monitor and regulate the flow of process gas, is coupled to the processing region 12 through gas injection plate 20, and is exhausted via vacuum pump 40. The monitoring and control of the gas injection system is facilitated by controller 42, wherein controller 42 is coupled to gas supply 48, mass flow controller 44, pressure sensor 46, chamber pressure sensor 49, substrate holder translation device 36 and vacuum pump 40. As a function of time, controller 42 monitors the injection total pressure via pressure sensor 46 and an exemplary time trace of pressure is shown in FIG. 12.

Figure 3:
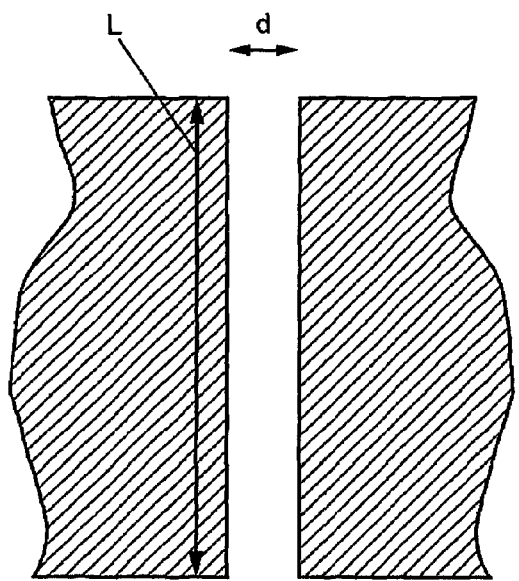
FIG. 3 is an enlarged cross-section of a shower-head injection orifice.

When an orifice, such as those depicted in FIGS. 5A–C, is eroded by plasma present on one side of the gas injection orifice, the gas injection orifice length L decreases in time followed by an increase in the gas injection orifice throat area once plasma has eroded through the entire length of the gas injection orifice length L. An example of plasma erosion of a gas injection orifice is shown in FIG. 13. In FIG. 13, a (cleaved) cross-section of a gas injection orifice, similar to the one depicted in FIG. 3, is shown where the left end of the orifice has been eroded. A decrease in the orifice length L corresponds to a decrease in the orifice aspect ratio L/d, which, in turn, leads to an increase of the discharge coefficient. An increase in the discharge coefficient appears as an increase in the effective throat area and translates into a decrease in injection total pressure as shown in FIG. 12 (region 600). Moreover, an increase in the throat area is also observed as a decrease in the injection total pressure as shown in FIG. 12 (region 610). However, due to differing rates in which the length L and throat diameter d vary, the former and latter erosion regimes can be distinguished by a change in the slope of the pressure trace of FIG. 12.

Figure 12:
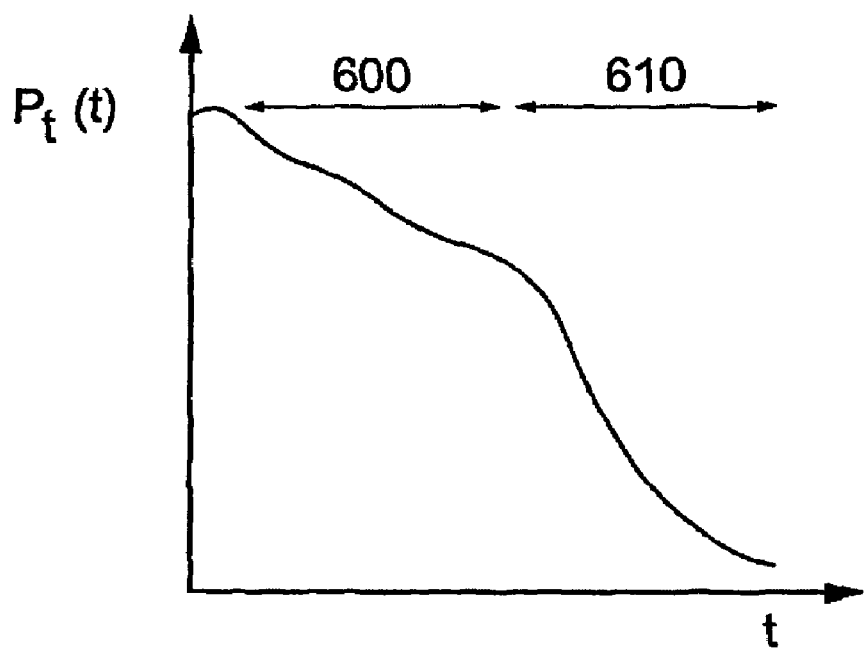
FIG. 12 is a schematic representation of the inject total pressure during gas injection orifice erosion.
Figure 13:
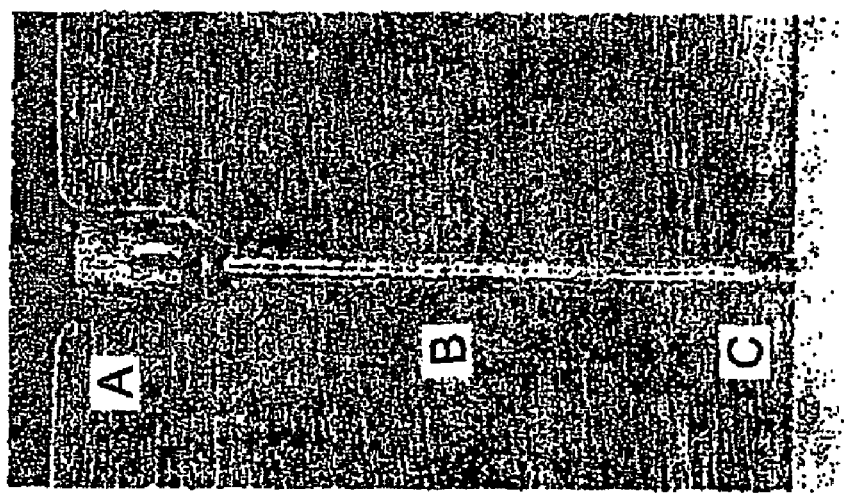
FIG. 13 is a photograph of a gas injection orifice subjected to plasma erosion.

When the injection total pressure, as shown in FIG. 12, falls below a threshold value, controller 42 can provide an alert to schedule a replacement of the (consumable) gas injection system components. Controller 42 can also counter the degradation of the gas injection system by altering process gas flow properties to compensate for the variation in the gas injection orifice discharge coefficient and, thereby, extend the lifetime of the consumable.

Using equation (1), the measured injection total pressure can be related to the "theoretical" (or isentropic) mass flow rate. By further recording the (real) mass flow rate at the mass flow rate controller 44, a ratio of the real mass flow rate to the isentropic mass flow rate provides an average discharge coefficient for the gas injection system. When the gas injection orifice is eroded (FIG. 13), the orifice aspect ratio L/d decreases, and subsequently, when the injection total pressure decreases (FIG. 12), the orifice Knudsen number Kn increases. Due to the decreasing aspect ratio L/d and increasing Knudsen number Kn, the discharge coefficient changes since, as described with reference to FIG. 6, the discharge coefficient is a function of the orifice aspect ratio L/d and the Knudsen number Kn.

Figure 14:
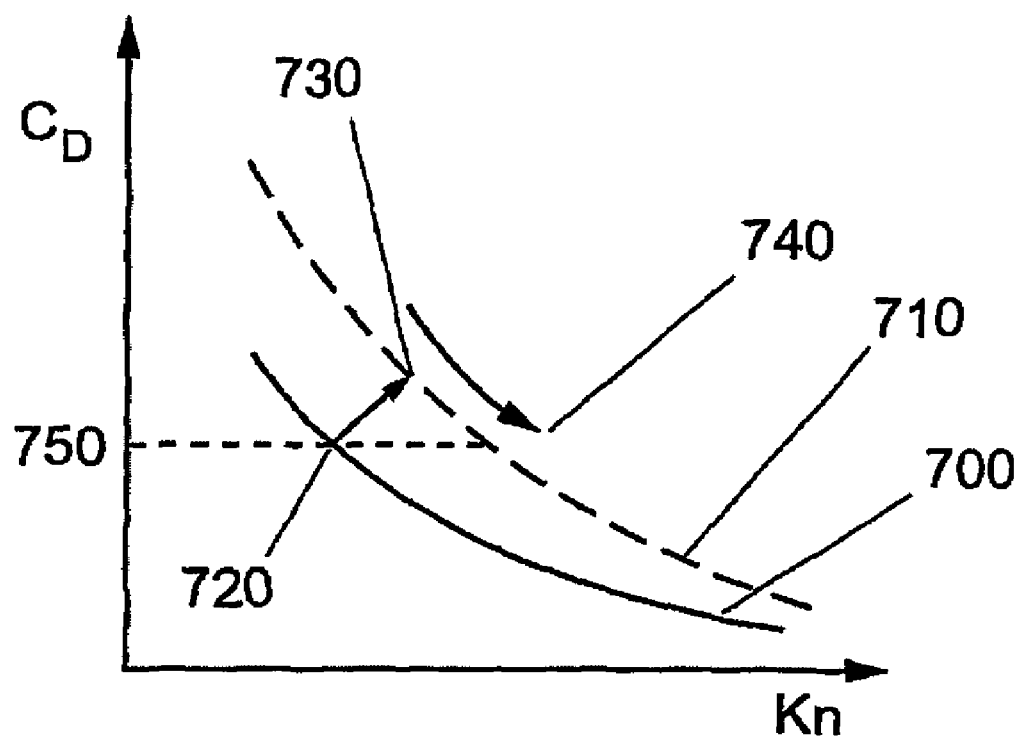
FIG. 14 is an exemplary representation of a control path for adjusting the discharge coefficient.

Such a variation in the discharge coefficient can be observed as a movement across characteristics (700 and 710) shown in FIG. 14. In FIG. 14, a gas injection system is designed to operate at a first point 720 on a first characteristic 700. As the discharge coefficient varies and the process gas mass flow rate is maintained constant (via mass flow controller 44), the operating point shifts from first point 720 on the first characteristic 700 to second point 730 on second characteristic 710. Depending on the dependence of the discharge coefficient on the orifice aspect ratio L/d and the orifice Knudsen number Kn, the second point 730 can have a discharge coefficient greater than (as illustrated in FIG. 14) or less than the discharge coefficient of the first point 720. In the case of FIG. 14, by decreasing the mass flow rate to further decrease the injection total pressure, controller 42 moves the operating point from second point 730 on second characteristic 710 to third point 740 on second characteristic 710, and return to the design discharge coefficient of value indicated by the (short) dashed line 750. By following a control sequence such as discussed, the gas injection system discharge coefficient can be held constant and consequently the material processing system 1 can extend use of gas injection consumables prior to replacement (as long as the process mass flow rate is not substantially varied beyond control limits set for the process recipe).

It should be noted that the exemplary embodiments depicted and described herein set forth the preferred embodiments of the present invention, and are not meant to limit the scope of the claims hereto in any way. Numerous modifications and variations of the present invention are possible in light of the above teachings. It is therefore to be understood that, within the scope of the appended claims, the invention may be practiced otherwise than as specifically described herein.

What is claimed is:

1. A material processing system for processing a substrate, comprising:
   a processing chamber;
   a vacuum pump coupled to the processing chamber;
   a gas injection system comprising a gas injection plate including a plurality of shaped gas injection orifices configured to inject a gas into the processing chamber substantially normal to a surface of the substrate; and
   a process controller coupled to the processing chamber, the vacuum pump, and the gas injection system and configured to control the processing of the substrate by maximizing the number of particles proximate the surface of the substrate moving in a direction substantially normal to the surface of the substrate, wherein the controller is configured to vary a mass flow rate of a process gas based on a measured variation in total injection pressure such that a gas injection system discharge coefficient remains constant.

2. The material processing system as claimed in claim 1, wherein each shaped gas injection orifice has a probability distribution function (PDF) related thereto, wherein the PDF is a function of a gas velocity angle relative to a surface normal vector at the surface of the substrate.

3. The material processing system as claimed in claim 2, wherein the gas velocity incidence angle is dependent upon an acceptance angle for a high-aspect ratio feature on the substrate.

4. The material processing system as claimed in claim 1, wherein at least one of the plurality of shaped gas injection orifices comprises a divergent nozzle.

5. The material processing system as claimed in claim 1, wherein at least one of the plurality of shaped gas injection orifices comprises a sonic orifice.

6. The material processing system as claimed in claim 1, wherein at least one of the plurality of shaped gas injection orifices comprises a simple orifice.

7. The material processing system as claimed in claim 1, wherein a discharge coefficient is established for each of the shaped gas injection orifices to maximize the number density proximate the surface of the substrate.

8. The material processing system as claimed in claim 1, wherein the gas injection plate is located a first distance from the surface of the substrate.

9. The material processing system as claimed in claim 1, wherein the plurality of shaped gas injection orifices are formed using at least one etching process.

10. The material processing system as claimed in claim 1, wherein the plurality of shaped gas injection orifices are formed using at least one deposition process.

11. The material processing system as claimed in claim 1, wherein the gas injection plate comprises silicon.

12. The material processing system as claimed in claim 1, wherein the gas injection plate is removeably mounted in the processing chamber.

13. The material processing system as claimed in claim 1, wherein the gas injection system further comprises a plurality of gas distribution manifolds and the gas injection plate is coupled to at least one of the plurality of gas distribution manifolds.

14. The material processing system as claimed in claim 1, wherein the gas injection plate is process dependent.

15. The material processing system as claimed in claim 1, wherein the gas injection plate has a doping profile that is process dependent.

16. The material processing system as claimed in claim 1, wherein the gas injection plate comprises an orifice pattern that is process dependent.

17. The material processing system as claimed in claim 1, wherein the separation distance between shaped gas injection orifices is substantially constant.

18. The material processing system as claimed in claim 1, wherein the separation distance between shaped gas injection orifices is process dependent.

19. The material processing system as claimed in claim 1, wherein the process controller is for determining a distance between the gas injection plate and the surface of the substrate.

20. The material processing system as claimed in claim 1, further comprising:
   a pressure gauge configured to monitor a pressure of the injected gas as the injected gas enters the plasma processing chamber, wherein the process controller is configured to monitor whether the pressure of the injected gas is below a threshold as the injected gas enters the plasma processing chamber and to identify that the gas injection plate needs to be changed if the pressure is below the threshold.

* * * * *